(12) United States Patent
Yeh et al.

(10) Patent No.: US 7,915,105 B2
(45) Date of Patent: Mar. 29, 2011

(54) METHOD FOR PATTERNING A METAL GATE (75) Inventors: Matt Yeh, Hsinchun (TW); Shun Wu Lin, Taichung (TW); Chung-Ming Wang, Chiayi (TW); Chi-Chun Chen, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 170 days.

(21) Appl. No.: 12/431,838

(22) Filed: Apr. 29, 2009

(65) Prior Publication Data

US 2010/0112811 A1    May 6, 2010

Related U.S. Application Data (60) Provisional application No. 61/111,913, filed on Nov. 6, 2008.

(51) Int. Cl.
*H01L 21/338*   (2006.01)
*H01L 21/8234*  (2006.01)
*H01L 21/336*   (2006.01)

(52) U.S. Cl. .. 438/176; 438/275; 438/283; 257/E21.444

(58) Field of Classification Search .................. 438/157, 438/176, 275, 283, 926; 257/E21.444
See application file for complete search history.

(56) References Cited

U.S. PATENT DOCUMENTS

| 6,001,698 | A | * | 12/1999 | Kuroda | 438/303 |
| 6,794,281 | B2 | | 9/2004 | Madhukar et al. | |
| 6,921,711 | B2 | | 7/2005 | Cabral, Jr. et al. | |
| 2001/0055842 | A1 | * | 12/2001 | Uh et al. | 438/183 |
| 2003/0205767 | A1 | | 11/2003 | Ma et al. | |
| 2005/0009343 | A1 | * | 1/2005 | Fishburn et al. | 438/689 |
| 2005/0266694 | A1 | | 12/2005 | Brask et al. | |
| 2006/0160342 | A1 | | 7/2006 | Doczy et al. | |
| 2009/0057769 | A1 | * | 3/2009 | Wei et al. | 257/369 |
| 2009/0242997 | A1 | * | 10/2009 | Yu et al. | 257/379 |

* cited by examiner

*Primary Examiner* — Hsien-ming Lee
*Assistant Examiner* — Kevin Parendo
(74) *Attorney, Agent, or Firm* — Haynes and Boone, LLP (57) ABSTRACT The present disclosure provides a method for fabricating a semiconductor device. The method includes forming first, second, third, and fourth gate structures on a semiconductor substrate, each gate structure having a dummy gate, removing the dummy gate from the first, second, third, and fourth gate structures, thereby forming first, second, third, and fourth trenches, respectively, forming a metal layer to partially fill in the first, second, third, and fourth trenches, forming a first photoresist layer over the first, second, and third trenches, etching a portion of the metal layer in the fourth trench, removing the first photoresist layer, forming a second photoresist layer over the second and third trenches, etching the metal layer in the first trench and the remaining portion of the metal layer in the fourth trench, and removing the second photoresist layer.

18 Claims, 10 Drawing Sheets

METHOD FOR PATTERNING A METAL GATE

PRIORITY DATA

This application claims priority to Provisional Application Ser. No. 61/111,913 filed on Nov. 6, 2008, entitled "A Method For Patterning A Metal Gate," the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

During the scaling trend, various materials have been implemented for the gate electrode and gate dielectric for CMOS devices. Metal-oxide semiconductor (MOS) transistors have typically been formed with polysilicon gate electrodes. Polysilicon material has been used due to its thermal resistive properties during high temperature processing, which allows it to be annealed at high temperatures along with source/drain structures. Furthermore, polysilicon's ability to block the ion implantation of doping atoms into the channel region is advantageous, as it allows for the easy formation of self aligned source/drain structures after gate patterning.

However, there has been a desire to fabricate these devices with a metal material for the gate electrode and a high-K dielectric for the gate dielectric. It may be advantageous to replace the polysilicon gate electrode with a metal gate electrode to improve device performance as feature sizes continue to decrease. One process of forming a metal gate stack is termed a "gate last" process in which the final gate stack is fabricated "last" which allows for reduced number of subsequent processes, including high temperature processing, that are be performed after formation of the gate. In the gate last process, a dummy poly gate is initially formed and may continue with processing until deposition of an interlayer dielectric (ILD). A chemical mechanical polishing (CMP) is typically performed on the ILD layer to expose the dummy poly gate. The dummy poly gate may then be removed and replaced with a true metal gate. As device sizes continue to get scaled down, it may be harder to control the thickness of the metal material deposited over the gate electrode. A bottom coverage effect may lead to uneven thickness for these metal materials depending on the size of the gate which can adversely affect subsequent processing. In addition, photoresist peeling may be an issue, especially if the etching time is long.

SUMMARY

One of the broader forms of an embodiment of the invention involves a method for fabricating a semiconductor device. The method includes forming first, second, third, and fourth gate structures on a semiconductor substrate, each gate structure having a dummy gate, removing the dummy gate from the first, second, third, and fourth gate structures, thereby forming first, second, third, and fourth trenches, respectively, forming a metal layer to partially fill the first, second, third, and fourth trenches, forming a first photoresist layer over the first, second, and third trenches, etching a portion of the metal layer in the fourth trench, removing the first photoresist layer, forming a second photoresist layer over the second and third trenches, etching the metal layer in the first trench and the remaining portion of the metal layer in the fourth trench, and removing the second photoresist layer.

Another one of the broader forms of an embodiment of the invention involves a method for fabricating a semiconductor device. The method includes forming first, second, third, and fourth gate structures on a semiconductor substrate, each gate structure having a dummy gate, removing the dummy gate from the first, second, third, and fourth gate structures, thereby forming first, second, third, and fourth trenches, respectively, forming a metal layer to fill the first, second, third, and fourth trenches, forming a first photoresist layer over the first, second, and third trenches, etching a portion of the metal layer in the fourth trench, the etching is performed for a time period not exceeding a photoresist peeling time window, removing the first photoresist layer, forming a second photoresist layer over the second and third trenches, etching the metal layer in the first trench and the remaining portion of the metal layer in the fourth trench, the etching is performed for a time period not exceeding the photoresist peeling time window, and removing the second photoresist layer.

Yet another one of the broader forms of an embodiment of the invention involves a method for fabricating a semiconductor device. The method includes forming first, second, third, and fourth gate structures on a semiconductor substrate, each gate structure having a dummy gate, wherein the first gate structure has a gate length that is smaller than a gate length of the fourth gate structure, removing the dummy gate from the first, second, third, and fourth gate structures, thereby forming first, second, third, and fourth trenches, respectively, forming a metal layer to fill in the first, second, third, and fourth trenches, forming a first photoresist layer to fill the first, second, and third trenches, etching a portion of the metal layer in the fourth trench, removing the first photoresist layer, forming a second photoresist layer over the second and third trenches, etching the metal layer in the first trench and the remaining portion of the metal layer in the fourth trench, and removing the second photoresist layer.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
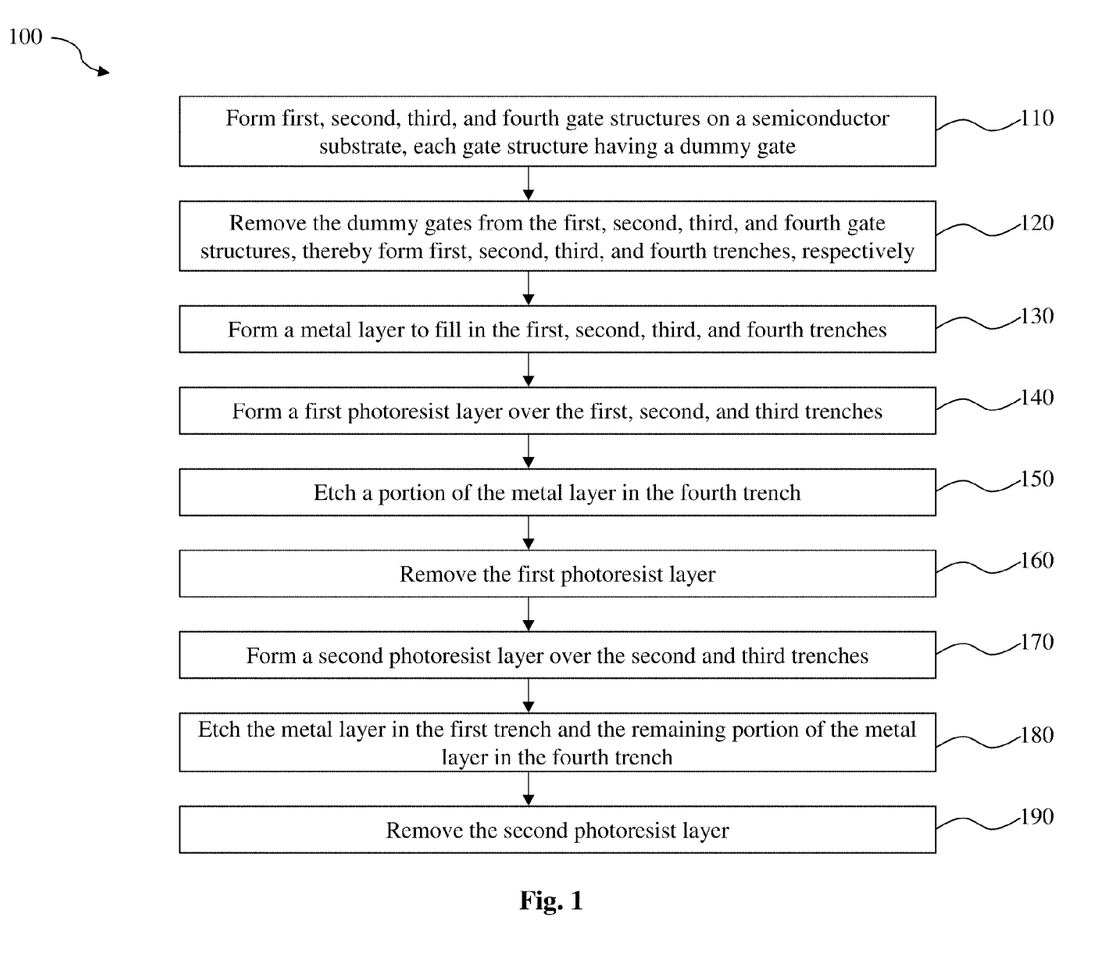
FIG. 1 is a flow chart illustrating a method for fabricating a semiconductor device within a gate last process according to various aspects of the present disclosure.

Illustrated in FIG. 1 is a flowchart of a method 100 for fabricating a semiconductor device in a gate last process according to various aspects of the present disclosure. FIGS. 2A to 2I illustrate cross-sectional views of one embodiment of a semiconductor device 200 at various stages of fabrication according to the method 100 of FIG. 1. It is understood that FIGS. 2A to 2I have been simplified for a better understanding of the inventive concepts of the present disclosure. The semiconductor device 200 may be an integrated circuit, or portion thereof, that may comprise static random access memory (SRAM) and/or other logic circuits, passive components such as resistors, capacitors, and inductors, and active components such as P-channel field effect transistors (pFET), N-channel FET (nFET), metal-oxide semiconductor field effect transistors (MOSFET), or complementary metal-oxide semiconductor (CMOS) transistors. It should be noted that some features of the semiconductor device 200 may be fabricated with a CMOS process flow but are not illustrated for the sake of clarity. Accordingly, it is understood that additional processes may be provided before, during, and after the method 100 of FIG. 1, and that some other processes may only be briefly described herein.

Figure 2A:
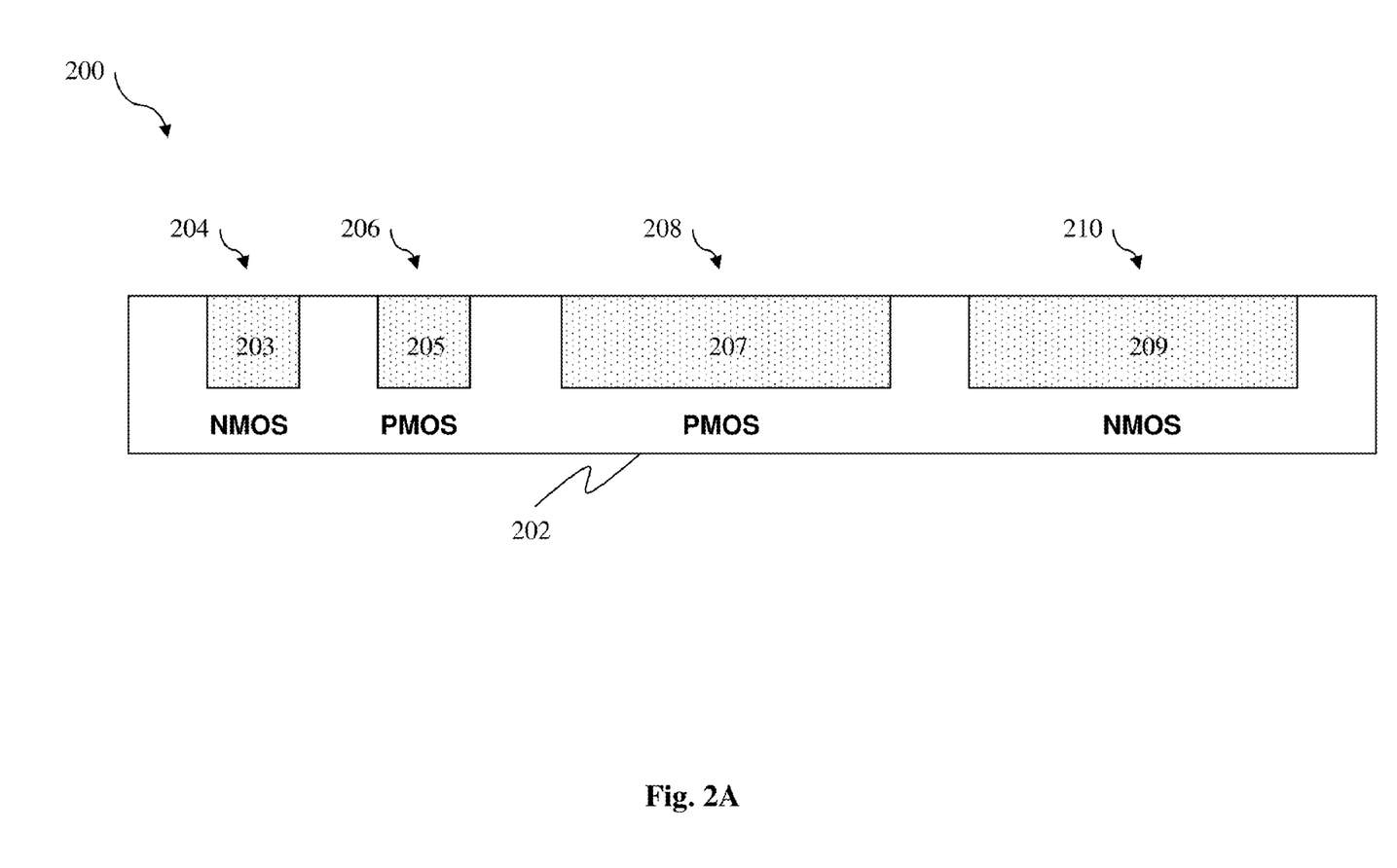
FIGS. 2A to 2I are cross-sectional views of a semiconductor device at various stages of fabrication according to the method of FIG. 1.

Referring to FIG. 1, the method 100 begins with block 110 in which first, second, third, and fourth gate structures, each having a dummy gate, are formed over a semiconductor substrate. Referring also to FIG. 2A, the semiconductor device 200 may include a substrate 202. In the present embodiment, the substrate 202 includes a silicon substrate (e.g. wafer) in crystalline structure. The substrate 202 may include various doping configurations depending on design requirements as is known in the art (e.g., p-type substrate or n-type substrate). Additionally, the substrate 202 may include various doped regions such as p-type wells (p-wells) or n-type wells (n-wells). The substrate 202 may also include other elementary semiconductors such as germanium and diamond. Alternatively, the substrate 202 may include a compound semiconductor such as, silicon carbide, gallium arsenide, indium arsenide, or indium phosphide. Further, the substrate 202 may optionally include an epitaxial layer (epi layer), may be strained for performance enhancement, and may include a silicon-on-insulator (SOI) structure.

The semiconductor device 200 may further include isolation structures (not shown) such as shallow trench isolation (STI) features formed in the substrate 202 to isolate one or more devices from each other. The STI features may include silicon oxide, silicon nitride, silicon oxynitride, fluoride-doped silicate (FSG), and/or a low-K dielectric material known in the art. Other isolation methods and/or features are possible in lieu of or in addition to STI. The STI features may be formed using processes such as reactive ion etch (RIE) of the substrate 202 to form trenches which are then filled with an insulator material using deposition processes followed by a chemical-mechanical-polishing (CMP) process.

It should be noted that additional features and structures may be formed but are not illustrated herein. For example, an interfacial layer (e.g., thermal oxide or chemical oxide) may be formed on the substrate 202. The interfacial layer may include a thickness ranging from about 5 angstroms and about 10 angstroms. Also, a high-K dielectric film may be formed over the interfacial layer. The high-K film may be formed by atomic layer deposition (ALD), chemical vapor deposition (CVD), or other suitable process. The high-K dielectric film may include $HfO_2$, HfSiO, HfSiON, and HfZrO. The high-K film may include a thickness ranging from about 10 angstroms to about 30 angstroms. Further, a metal-1 film may be formed as a wet etch stop layer over the high-K film layer. The metal-1 film may be formed by physical vapor deposition (PVD or sputtering), ALD, CVD, or other suitable process. The metal-1 film layer may include a thickness ranging from about 10 angstroms to about 200 angstroms. The material used for the metal-1 film layer may include TaN, TaSiN, W, TaC, TaCN, TiAlN, Al, TiN, and Ti. Moreover, additional processing steps may be performed, including depositing a polysilicon layer (poly layer), depositing hard mask layer, gate patterning, growing SiGe features, forming a lightly-doped-drain (LDD) regions, forming sidewall spacers, forming source and drain regions, forming silicide features (e.g. NiSi), and forming an inter-layer dielectric (ILD). In a gate last process, a chemical mechanical polishing (CMP) process may be performed on the ILD to expose the dummy poly gates for removal. The formation and removal of the dummy poly gates are discussed in detail below.

Still referring to FIG. 2A, a plurality of gate structures 204, 206, 208, 210 may be formed on the substrate 202, where each gate structure 204, 206, 208, 210 has a dummy gate 203, 205, 207, 209, respectively. The formation of the gate structures 204, 206, 208, 210 includes forming various material layers discussed above, and patterning (e.g., gate etching) the various material layers to form the gate structures that may be part of NMOS or PMOS devices, for example. The gate structures 204, 206, 208, 210 may include dummy gates 203, 205, 207, 209 having the polysilicon material. Alternatively, the dummy gates may be formed of an amorphous silicon instead of the polysilicon. The dummy gates 203, 205, 207, 209 may be removed and replaced with a metal material in a gate last process flow.

In the present embodiment, the gate structures 204 and 210 may be part of NMOS devices, where the gate structure 204 has a smaller gate length than the gate structure 210. For example, the gate length of gate structure 204 may be between about 0.028 um and 0.03 um, and the gate length of gate structure 210 may be between about 1 um and 10 um. Similarly, the gate structures 206 and 208 may be part of PMOS devices, where the gate structure 206 has a smaller gate length than the gate structure 208. For example, the gate length of gate structure 206 may be between about 0.028 to 0.03 um, and the gate length of gate structure 208 may be between about 1 to 10 um.

In an alternative embodiment, the gate structures 204 and 210 may be part of PMOS devices, where the gate structure 204 has a smaller gate length than the gate structure 210. For example, the gate length of gate structure 204 may be between about 0.028 um and 0.03 um, and the gate length of gate structure 210 may be between about 1 um and 10 um. Similarly, the gate structures 206 and 208 may be part of NMOS devices, where the gate structure 206 has a smaller gate length than the gate structure 208. For example, the gate length of gate structure 206 may be between about 0.028 to 0.03 um, and the gate length of gate structure 208 may be between about 1 to 10 um. It is understood that the specified gate lengths of the NMOS and PMOS devices are mere examples and that other gate lengths may be implemented depending on the technology process node used for fabricating the semiconductor device and the type of application that the semiconductor device is used for.

Figure 2B:
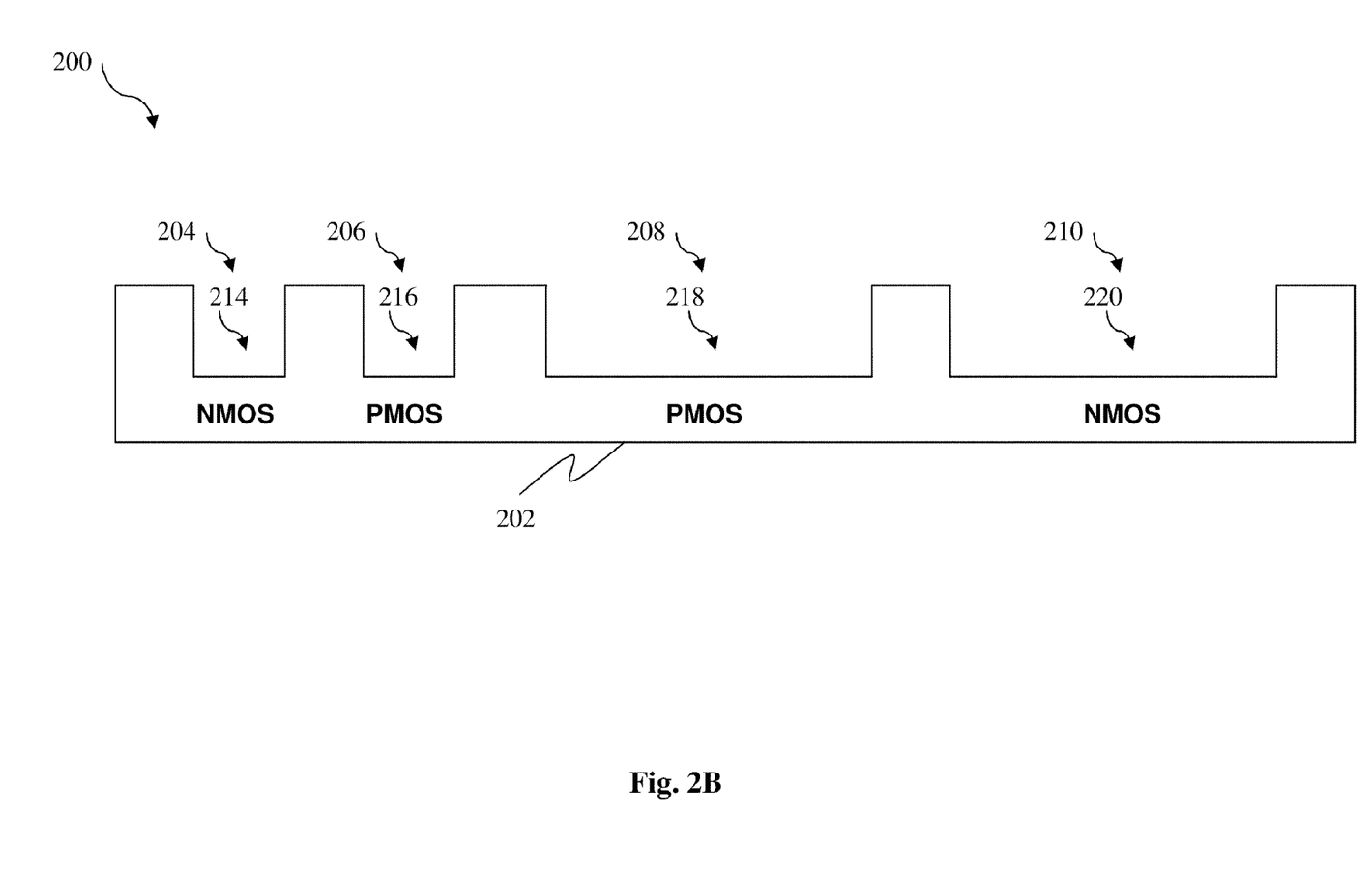

The method 100 continues with block 120 in which the dummy gates may be removed from the first, second, third, and fourth gate structures thereby forming a plurality of trenches. Referring now to FIG. 2B, the dummy gates 203, 205, 207, 209 may be removed from the gate structures, 204, 206, 208, 210, thereby creating trenches 214, 216, 218, 220, respectively. The dummy gates 203, 205, 207, 209 may be removed by a selective etching process. The selective etching process may employ either a wet etching method or a dry etching method or a combination wet and dry etching method. In one embodiment, a wet etching process includes exposure to a hydroxide containing solution (e.g. ammonium hydroxide), de-ionized water, and/or other suitable etchant solutions. The size of the trenches 214-220 depends upon the gate length of the gate structures 204, 206, 208, 210. As mentioned previously, for both the present embodiment and the alternative embodiment, the gate length of gate structures 204 and 206 is about 0.028 to 0.03 um, and the gate length of gate structures 208 and 210 is about 1 to 10 um. Accordingly, trenches 214 and 216 may be referred to as "small" trenches, and trenches 218 and 220 may be referred to as "large" trenches. It is understood that the terms small and large are not meant to limit the scope of the present embodiment but used herein to compare different gate lengths in relative terms.

Figure 2C:
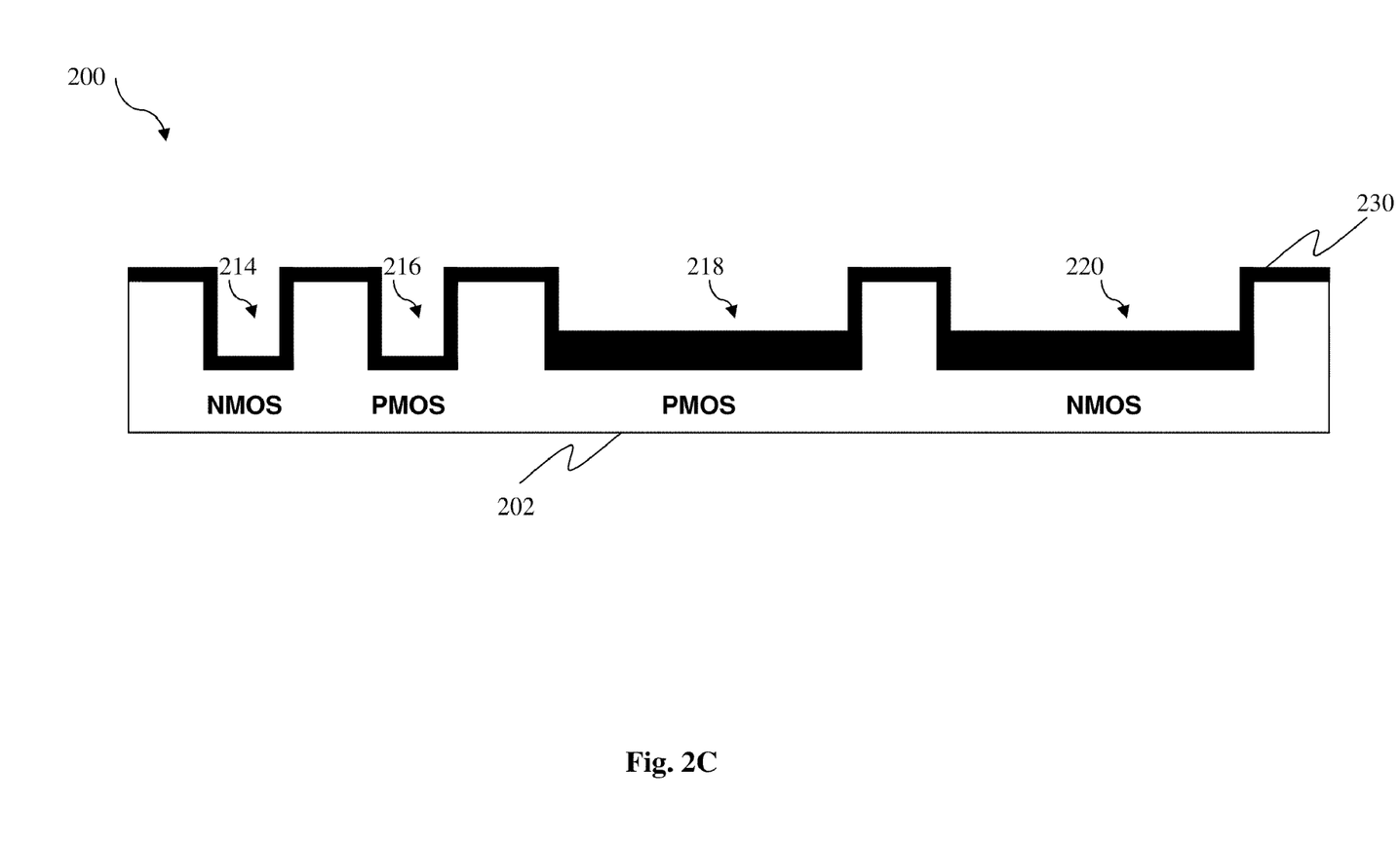

The method 100 continues with block 130 in which a metal layer may be formed to partially fill in the first, second, third, and fourth trenches. Referring now to FIG. 2C, the metal layer 230 may be deposited to partially fill in the trenches 214-220. The metal layer 230 deposited may be any metal material suitable for forming a metal gate or portion thereof, including work function layers, liner layers, interface layers, seed layers, adhesion layers, barrier layers, etc. The metal layer 230 may include one or more layers including TiN, TaN, TaC, TaSiN, W, TaCN, Al, Ti, WN, TiAl, TiAlN, combinations thereof, and/or other suitable materials. For example, if a P-type work function metal (P-metal) for PMOS devices is desired, TiN, WN, or W may be used. On the other hand, if an N-type work function metal (N-metal) for NMOS devices is desired, TiAl, TiAlN, or TaCN, may be used. In the present embodiment, the metal layer 230 includes a P-metal. That is, the P-metal may be formed first followed by patterning to form the metal gates. The metal layer 230 may be formed by PVD (sputtering), or other suitable processes.

In the present embodiment, the metal layer 230 includes a thickness ranging from about 10 to about 200 angstroms (A). The metal layer 230 formed in the large trenches 218 and 220 may have a greater thickness than the metal layer 230 formed in the small trenches 214 and 216. The thickness difference between the metal layer 230 deposited in the large trenches 218 and 220 and small trenches 214 and 216 may be caused by a PVD metal film bottom coverage effect, and is undesirable. For example, it has been observed that, for a device having a large gate length of about 1 um, the metal layer 230 may have a thickness of about 166 A at the bottom of the trenches 218 and 220. In contrast, a device having a small gate length of about 0.03 um may have a metal layer 230 having a thickness of about 67 A at the bottom of the trenches 214 and 216. One advantage of the present embodiment is that the undesirable effects caused by the difference in the metal layer thickness may be minimized. This is discussed in further detail later in the disclosure.

Figure 2D:
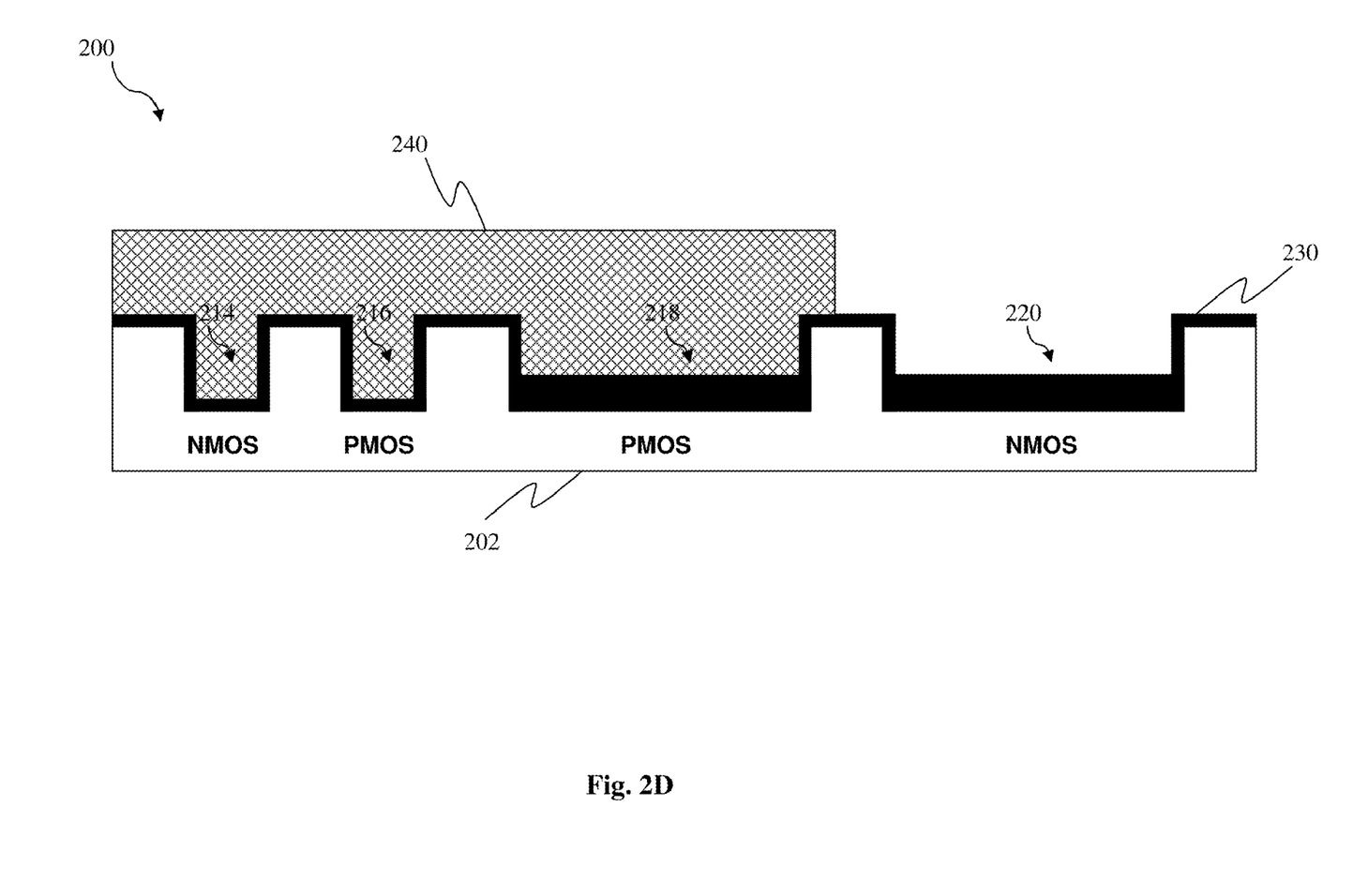

The method 100 continues with block 140 in which a first photoresist layer is formed over the first, second, and third trenches. Referring now to FIG. 2D, a photoresist layer 240 is formed over the trenches 214, 216, and 218. The photoresist layer 240 may be formed by photolithography, immersion lithography, ion-beam writing, or other suitable process. For example, the photolithography process may include spin coating, soft-baking, exposure, post-baking, developing, rinsing, drying, and other suitable process. The photoresist layer 240 may include a thickness ranging from about 1,000 angstroms to 20,000 angstroms, preferably about 2,000 angstroms. The photoresist layer 240 may be used to pattern the metal layer 230 and remove a portion thereof. In the present embodiment, the metal layer 230 (P-metal) may be removed from the trenches 214 and 220 of the NMOS devices.

Figure 2E:
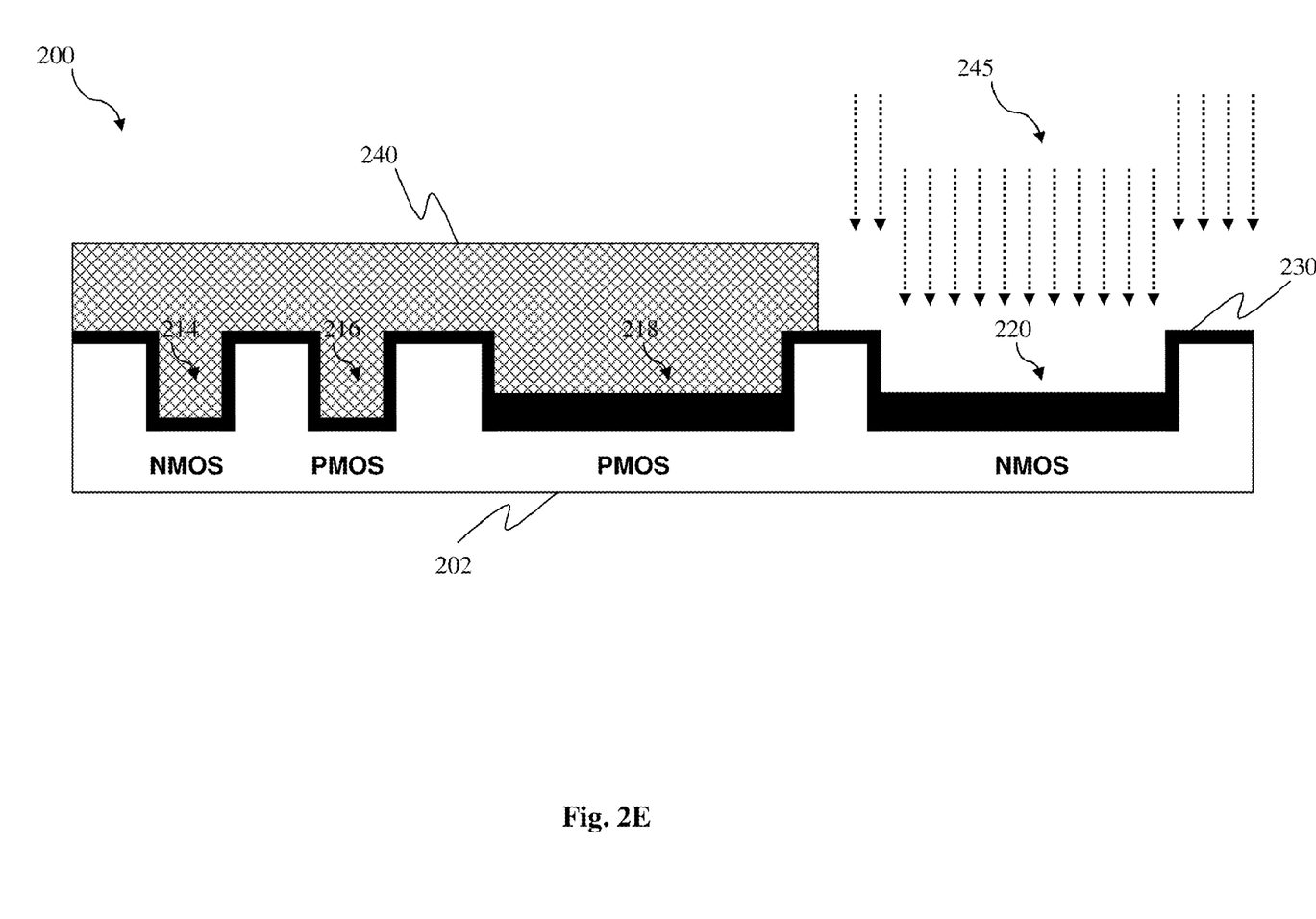

The method 100 continues with block 150 in which a portion of the metal layer in the fourth trench may be removed by a first etching process. Referring now to FIG. 2E, an etching process 245 may be performed on the metal layer 230 in the trench 220, which is left exposed by the photoresist layer 240. The etching process 245 may utilize an etchant that is suitable for etching metals. In the present embodiment, the etching process 245 may be a SC1 (standard clean 1) process, where the etching solution includes $NH_4OH$: $H_2O_2$:de-ionized water with a ratio of 1:1:5 by volume. Also in the present embodiment, the etching process 245 may be performed at a temperature of about 50 C for a period of about 20 seconds. One advantage of the present embodiment is that the risk of photoresist peeling is minimized. Photoresist peeling is an issue that arises due to several factors. First, when the photoresist layer 240 is applied directly over the metal layer 230, the photoresist layer 240 does not have good adhesion with the metal layer 230. Second, a wet etching process will produce an undercut profile (e.g. lateral etching) around the edge of the photoresist layer 240. This undercut profile becomes worse as device dimensions shrink, which may lead to even more photoresist peeling. The extent of the photoresist peeling is dependent on a photoresist peeling time window. If the etching process can be completed within the photoresist peeling time window, then at least the risk of photoresist peeling can be minimized. In the present embodiment, it has been observed that the photoresist peeling time window is about 25 seconds. Therefore, the present embodiment alleviates the photoresist peeling issue since the time duration for the etching process 245 is about 20 seconds, which is within the photoresist peeling time window. It is understood that the photoresist peeling time window specified above is a mere example, and that other time windows may be observed depending on, but not limited to, the type of materials (e.g., photoresist, metals, etching solution, etc.) and the technology process node.

Figure 2F:
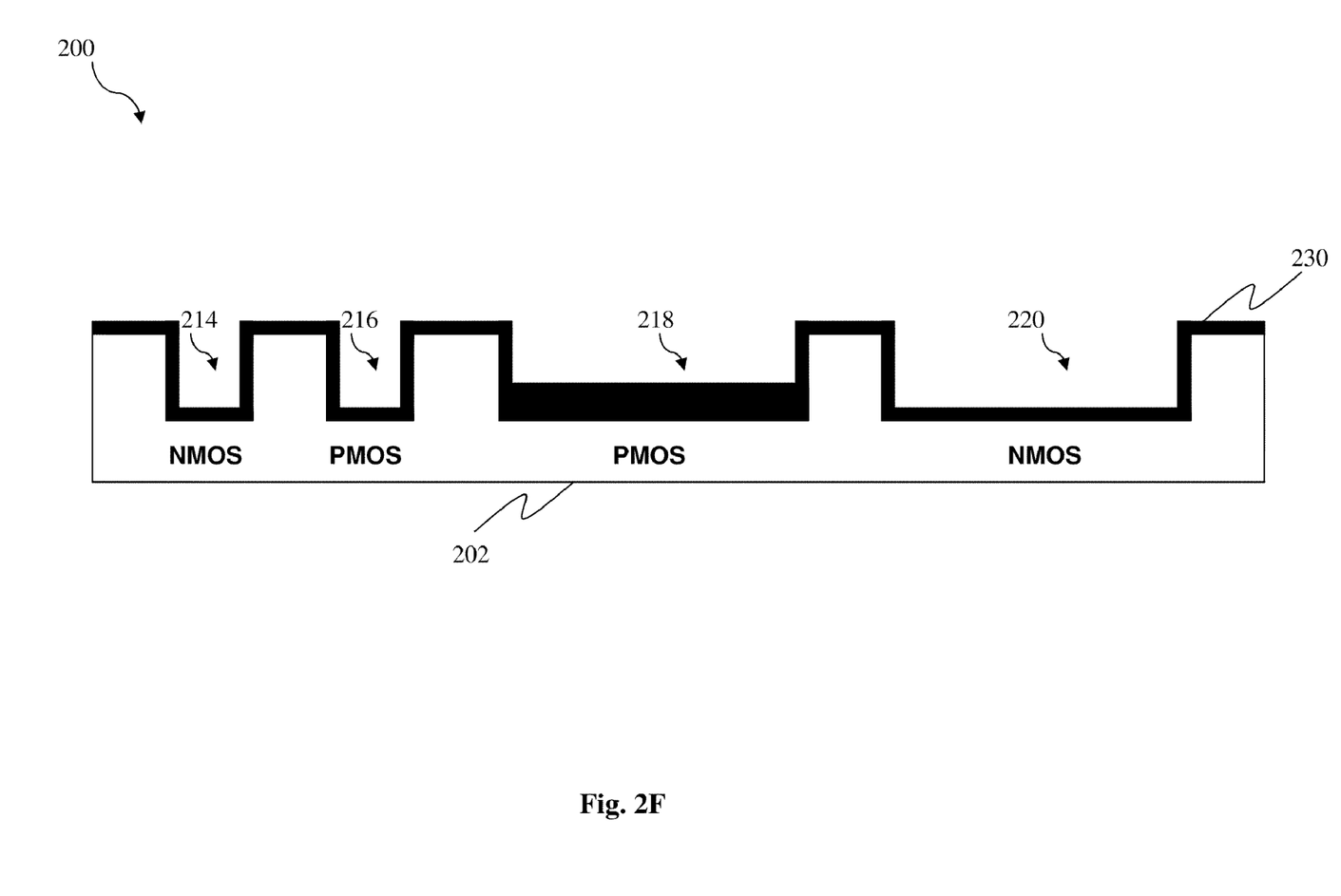

The method 100 continues with block 160 in which the first photoresist layer is removed. Referring to FIGS. 2E and 2F, the photoresist layer 240 may be removed by a stripping or ashing process known in the art. For example, a stripping process using a chemical solution may be applied. The chemical solution used for the photoresist stripping may be selected from N-methyl-2-pyrrolidine (NMP), OK-71, cyclohexanol, cyclopentanol, propylene glycol monomethyl ether (PGME), Propylene glycol monomethyl ether acetate (PGMEA), or another solvent-based photoresist stripper. Also illustrated in FIG. 2F, it should be noted that following the etching process 245 the thickness of the metal layer 230 at the bottom of the large trench 220 has been substantially reduced. It is understood that the etching time and temperature may be tuned and may depend on the desired amount of metal to be etched particularly at the bottom of the trench. Further, the amount of metal to be partially etched (at the bottom of the large trench 220) may depend on the thickness of the metal layer 230 at the bottom of the small trench 214 which may be removed concurrently in a subsequent etching process as discussed below.

Figure 2G:
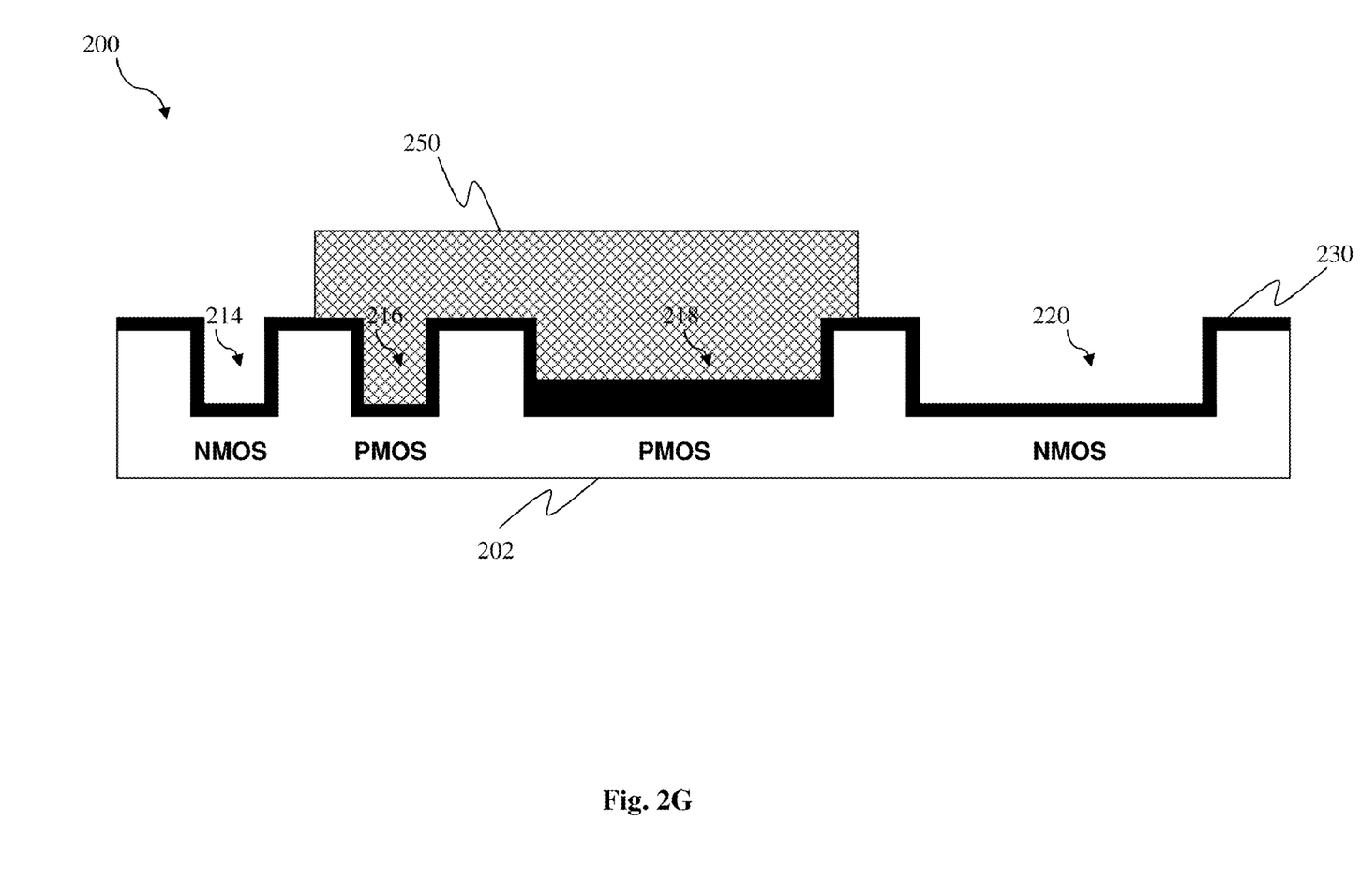

The method 100 continues with block 170 in which a second photoresist layer may be formed over the second and third trench. Referring now to FIG. 2G, a photoresist layer 250 is formed over the trenches 216 and 218 of the PMOS devices. The photoresist layer 250 may be formed by a similar process that was used to form the photoresist layer 240. The photoresist layer 250 may include a thickness ranging from about 1,000 angstroms to 20,000 angstroms, preferably about 2,000 angstroms. In the present embodiment, the photoresist layer 250 may be used to remove the metal layer 230 (P-metal) from the trenches 214 and 220 of the NMOS devices.

Figure 2H:
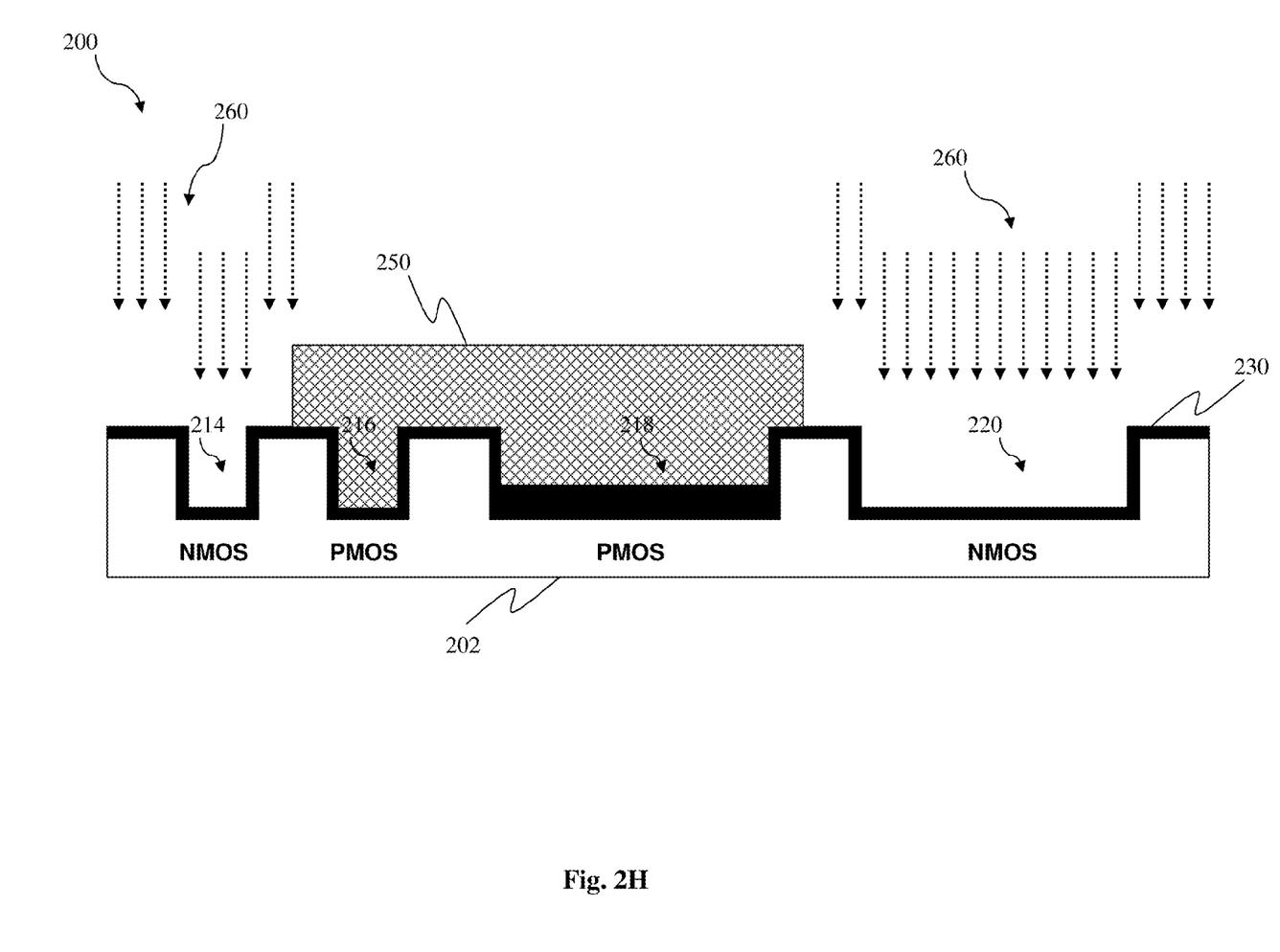

The method 100 continues with block 180 in which the metal layer in the first trench and the remaining metal layer in the fourth trench may be removed by a second etching process. Referring now to FIG. 2H, an etching process 260 may be performed on the metal layer 230 in trenches 214 and 220, which are both left exposed by the photoresist layer 250. The etching process 260 may utilize an etchant that is suitable for etching metals. In the present embodiment, the etching process 260 may be a SC1 (standard clean 1) process, where the etching solution includes $NH_4OH$: $H_2O_2$:de-ionized water with a ratio of 1:1:5 by volume. Also, in the present embodiment, the etching process 260 may be performed at a temperature of about 50 C and for a period of about 20 seconds. This short etching time also helps reduce the risk of photoresist peeling since it is within the photoresist peeling time window as discussed previously. Further, it should be noted that since the metal layer 230 at the bottom of the large trench 220 was already partially etched (block 150), there may be a small difference between the thickness of the metal layer 230 at the bottom of the small trench 214 and at the bottom of the large trench 220. Accordingly, the etching process 260 may be sufficient to remove all the metal layer 230 (P-metal) in the small trench 214 as well as in the large trench 220.

Figure 2I:
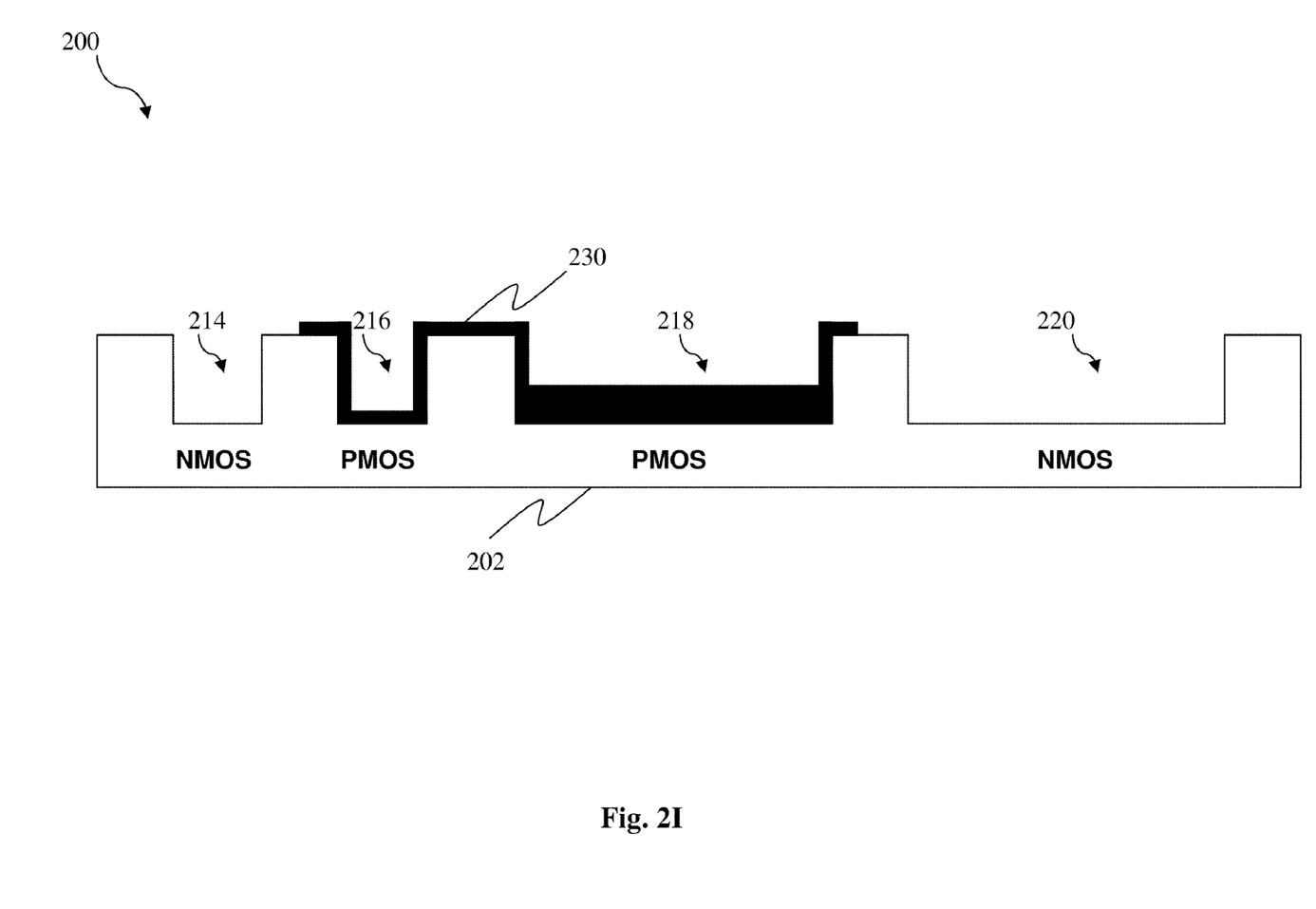

The method 100 continues with block 190 in which the second photoresist layer may be removed. Referring to FIGS. 2H and 2I, the photoresist layer 250 may be removed by a stripping or ashing process. The chemical solution used for the photoresist stripping may be selected from N-methyl-2-pyrrolidine (NMP), OK-71, cyclohexanol, cyclopentanol, propylene glycol monomethyl ether (PGME), Propylene glycol monomethyl ether acetate (PGMEA), or another solvent-based photoresist stripper. Also, illustrated in FIG. 2I is that after the etching process 260, the metal layer 230 in the trench 214 as well as the remaining portion of the metal layer 230 in the trench 220 may be substantially etched away. Thus, an advantage of the present embodiment is that even though the metal layer 230 in the small trench 214 initially had a different thickness compared to the metal layer 230 in the large trench 220, the two segments of the metal layer 230 can both be substantially etched away with minimum risk of photoresist peeling.

Although this is not illustrated, another metal layer may be deposited to partially fill the trenches 214 and 220 after the removal of the metal layer 230 from the trenches 214 and 220 in block 190. In the present embodiment, the metal layer may be an N-metal to form a metal gate for the NMOS devices. Accordingly, the present embodiment discloses forming the P-metal first followed by removing the P-metal from the trenches of the NMOS devices, and then partially filling these trenches with an N-metal. In an alternative embodiment, the method 100 may be implemented to form the N-metal first followed by removing the N-metal layer from the trenches of the PMOS devices, and then partially fill these trenches with P-metal to form the metal gate for the PMOS devices. Further, the metal gates of the NMOS and PMOS devices may further include a fill metal such as Al or W formed on the N-metal and P-metal, respectively, and a metal CMP may be performed to form the gate electrode.

Further, it is understood that the method 100 may continue with additional processing to form various contacts and vias, and a plurality of patterned dielectric layers and conductive layers may also be formed over the substrate 202 to form multilayer interconnects configured to couple the various doped regions, such as the source and drain regions and gate structures of the NMOS and PMOS devices. For example, an interlayer dielectric (ILD) and a multilayer interconnect (MLI) structure may be formed in a configuration such that the ILD separates and isolates each metal layer from other metal layers of the MLI structure. In furtherance of the example, the MIL structure includes contacts, vias and metal lines formed on the substrate. In one example, the MIL structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including PVD (or sputtering), CVD, or combinations thereof. Other manufacturing techniques to form the aluminum interconnect may include photolithography processing and etching to pattern the conductive materials for vertical connection (via and contact) and horizontal connection (conductive line). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect may be formed by a technique including CVD, PVD (sputtering), plating, or other suitable processes.

In summary, the methods and devices disclosed provide a effective approach to fabricate high-K metal gate devices in a gate last process. The method disclosed herein takes advantage of a shorter etching time and multiple etching cycles to reduce the risk of photoresist peeling. The method disclosed herein also takes advantage of a double patterning process to compensate for the PVD metal film bottom coverage effect in trenches with different sizes. Moreover, the methods disclosed herein implement materials and processes that are friendly and compatible with the CMOS process flow, and that are inexpensive to incorporate with the process flow. It is understood that different embodiments disclosed herein offer different advantages, and that no particular advantage is necessarily required for all embodiments.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, although the methods and devices have been described herein with a gate last process, it is contemplated that the methods and devices are applicable in a hybrid process that includes a gate last process flow and a gate first process flow.

What is claimed is:

1. A method of fabricating a semiconductor device comprising:
   forming first, second, third, and fourth gate structures on a semiconductor substrate, each gate structure having a dummy gate;
   removing the dummy gate from the first, second, third, and fourth gate structures, thereby forming first, second, third, and fourth trenches, respectively;
   forming a metal layer to partially fill the first, second, third, and fourth trenches, wherein the metal layer is thicker in the fourth trench than it is in the first trench;
   forming a first photoresist layer over the first, second, and third trenches;
   etching a portion of the metal layer in the fourth trench, leaving a remaining portion;
   removing the first photoresist layer;
   forming a second photoresist layer over the second and third trenches;
   etching the metal layer in the first trench and the remaining portion of the metal layer in the fourth trench; and
   removing the second photoresist layer.

2. The method of claim 1, wherein the metal layer includes a P-type work function metal or a N-type work function metal having a thickness ranging from about 10 Angstroms to about 200 Angstroms.

3. The method of claim 1, wherein the forming the metal layer includes forming the metal layer by physical vapor deposition (PVD).

4. The method of claim 1, wherein the metal layer is etched by a wet etching process that includes an etching solution utilizing $NH_4OH:H_2O_2$:de-ionized water with a 1:1:5 volume ratio.

5. The method of claim 4, wherein the wet etching process is performed at a temperature of about 50 °C. for a period not exceeding 25 seconds.

6. The method of claim 1, wherein the first photoresist layer and the second photoresist layer each includes a thickness of about 2,000 Angstroms.

7. A method of fabricating a semiconductor device comprising:
   forming first, second, third, and fourth gate structures on a semiconductor substrate, each gate structure having a dummy gate;
   removing the dummy gate from the first, second, third, and fourth gate structures, thereby forming first, second, third, and fourth trenches, respectively;
   forming a metal layer to partially fill the first, second, third, and fourth trenches wherein the metal layer is thicker in the fourth trench than it is in the first trench;
   forming a first photoresist layer over the first, second, and third trenches;
   etching a portion of the metal layer in the fourth trench, leaving a remaining portion, the etching is performed for a first time period not exceeding a photoresist peeling time window;
   removing the first photoresist layer;
   forming a second photoresist layer over the second and third trenches;
   etching the metal layer in the first trench and the remaining portion of the metal layer in the fourth trench, the etching is performed for a second time period not exceeding the photoresist peeling time window; and
   removing the second photoresist layer.

8. The method of claim 7, wherein the metal layer includes a P-type work function metal or a N-type work function metal having a thickness ranging from about 10 Angstroms to about 200 Angstroms.

9. The method of claim 8, wherein the first and fourth gate structures are each part of an NMOS device if the metal layer includes the P-type work function metal; and
   wherein the first and fourth gate structures are each part of a PMOS device if the metal layer includes the N-type work function metal.

10. The method of claim 7, wherein the forming the metal layer includes forming the metal layer by PVD.

11. The method of claim 7, wherein the photoresist peeling time window is about 25 seconds.

12. The method of claim 7, wherein the first gate structure has a first gate length that is smaller than a forth gate length of the fourth gate structure.

13. A method of fabricating a semiconductor device comprising:
   forming first, second, third, and fourth gate structures on a semiconductor substrate, each gate structure having a dummy gate, wherein the first gate structure has a first gate length that is smaller than a fourth gate length of the fourth gate structure;
   removing the dummy gate from the first, second, third, and fourth gate structures, thereby forming first, second, third, and fourth trenches, respectively;
   forming a metal layer to partially fill the first, second, third, and fourth trenches, wherein the metal layer is thicker in the fourth trench than it is in the first trench;
   forming a first photoresist layer over the first, second, and third trenches;
   etching a portion of the metal layer in the fourth trench, leaving a remaining portion;
   removing the first photoresist layer;
   forming a second photoresist layer over the second and third trenches;
   etching the metal layer in the first trench and the remaining portion of the metal layer in the fourth trench; and
   removing the second photoresist layer.

14. The method of claim 13, wherein the gate length of the first gate structure ranges from about 0.028 micrometer to about 0.03 micrometer, and the gate length of the fourth gate structure ranges from about 1 micrometer to about 10 micrometer.

15. The method of claim 14, wherein the second gate structure has substantially a same gate length as the first gate structure, and the third gate structure has substantially a same gate lenght as the fourth gate structure.

16. The method of claim 13, wherein the first and fourth gate structures are each part of an NMOS device and the second and third gate structures are each part of a PMOS device.

17. The method of claim 13, wherein the first and fourth gate structures are each part of an PMOS device and the second and third gate structures are each part of a NMOS device.

18. The method of claim 13, wherein the forming the metal layer includes forming the metal layer by PVD.

* * * * *